US011889223B2

(12) United States Patent
Marinsek et al.

(10) Patent No.: US 11,889,223 B2
(45) Date of Patent: Jan. 30, 2024

(54) EXPLOSIVELY WELDED COOLED INFRARED CAMERA

(71) Applicant: Raytheon Company, Waltham, MA (US)

(72) Inventors: Stephen Marinsek, Albuquerque, NM (US); Thomas Peter Sprafke, Goleta, CA (US)

(73) Assignee: Raytheon Company, Waltham, MA (US)

( * ) Notice: Subject to any disclaimer, the term of this patent is extended or adjusted under 35 U.S.C. 154(b) by 500 days.

(21) Appl. No.: 17/219,251

(22) Filed: Mar. 31, 2021

(65) Prior Publication Data

US 2022/0321806 A1    Oct. 6, 2022

(51) Int. Cl.
| | |
|---|---|
| *H04N 5/33* | (2023.01) |
| *G01J 5/04* | (2006.01) |
| *G01J 5/00* | (2022.01) |
| *H01L 23/367* | (2006.01) |

(52) U.S. Cl.
CPC .............. *H04N 5/33* (2013.01); *G01J 5/04* (2013.01); *G01J 2005/0077* (2013.01); *H01L 23/367* (2013.01)

(58) Field of Classification Search
CPC ...... H04N 5/33; G01J 5/04; G01J 2005/0077; G01J 5/041; G01J 5/045; G01J 5/061; H01L 23/367; H01L 31/0203
See application file for complete search history.

(56) References Cited

U.S. PATENT DOCUMENTS

| | | | |
|---|---|---|---|
| 3,798,011 A | 3/1974 | Sharp, Jr. | |
| 4,039,870 A | 8/1977 | Sterrett | |
| 5,404,016 A | * 4/1995 | Boyd | F17C 3/085 |
| | | | 250/352 |

(Continued)

FOREIGN PATENT DOCUMENTS

| | | |
|---|---|---|
| CN | 105364294 A | 3/2016 |
| CN | 106793736 A | 5/2017 |

(Continued)

OTHER PUBLICATIONS

Basti, A. et al., "Optimization of ILC Cryomodule Design Using Explosion Welding Technology" 6th International Particle Accelerator Conference, Richmond, VA, USA, 2015, ISBN 978-3-95450-168-7, 4 pages.

(Continued)

*Primary Examiner* — David P Porta
*Assistant Examiner* — Meenakshi S Sahu
(74) *Attorney, Agent, or Firm* — Kinney & Lange, P.A.

(57) ABSTRACT

A cooled infrared camera includes a window housing comprising a plate having an opening, a window positioned in the opening of the plate, a first sidewall having a first end connected to the plate, a first flange connected to a second end of the first sidewall such that the first sidewall is between the plate and the first flange, a first explosively welded joint between the plate and the first sidewall, and a second explosively welded joint between the first sidewall and the first flange. A header is connected to the first flange of the window housing, and a warm end is connected to the header. The cooled infrared camera further includes a hermetically sealed chamber within the window housing and the header.

24 Claims, 2 Drawing Sheets

(56) References Cited

U.S. PATENT DOCUMENTS

| | | | |
|---|---|---|---|
| 5,598,966 A | 2/1997 | Romano et al. | |
| 2015/0314390 A1 | 11/2015 | Otsuka et al. | |

FOREIGN PATENT DOCUMENTS

| | | |
|---|---|---|
| CN | 206389687 U | 8/2017 |
| CN | 109317232 A | 2/2019 |
| KR | 2008049419 A | 6/2008 |

OTHER PUBLICATIONS

Sabirov, Basar et al., "Recent advances in Ti and Nb explosion welding with stainless steel for 2K operating (ILC Program)—To the prcoeedings of LCWS11" Jan. 2012, 8 pages.

Basti, A. et al., "Upgrade of the ILC Cryomodule", 16 pages.

* cited by examiner

EXPLOSIVELY WELDED COOLED INFRARED CAMERA

BACKGROUND

The present disclosure relates generally to Dewars, and in particular, to a cooled infrared camera.

Dewars are utilized to maintain a cold sensor environment. A Dewar contains a sensor assembly that requires low temperatures in order to reduce thermal noise generated by the sensor. A window connected to the window housing is positioned over the sensor assembly to provide visual access to the sensor. A coldfinger extends through a header attached to the window housing to maintain a cold environment around a platform holding the sensor assembly within the Dewar. The header is attached to a warm end opposite the window housing. The window housing, the header, and the warm end are hermetically sealed such that the Dewar has a vacuum space in which the sensor is mounted. Typically, during formation of the Dewar, the window housing, the header, and the warm end are joined via joining processes such as welding or brazing. Limitations of those joining processes may affect the formation and/or performance of the Dewar.

SUMMARY

A cooled infrared camera includes a window housing comprising a plate having an opening, a window positioned in the opening of the plate, a first sidewall having a first end connected to the plate, a first flange connected to a second end of the first sidewall such that the first sidewall is between the plate and the first flange, a first explosively welded joint between the plate and the first sidewall, and a second explosively welded joint between the first sidewall and the first flange. A header is connected to the first flange of the window housing, and a warm end is connected to the header. The cooled infrared camera further includes a hermetically sealed chamber within the window housing and the header, a coldfinger extending through the header and into the window housing, a platform connected to the cold finger, and an infrared sensor assembly positioned on the platform.

A cooled infrared camera includes a window housing having an opening and a window positioned in the opening and a header connected to the window housing. The header comprises a first flange connected to the window housing, a first sidewall having a first end connected to the first flange, a second flange connected to a second end of the first sidewall such that the first sidewall is between the first flange and the second flange, a first explosively welded joint between the first flange and the first sidewall, and a second explosively welded joint between the first sidewall and the second flange. The cooled infrared camera further includes a warm end connected to the second flange of the header, a hermetically sealed chamber within the window housing and the header, a coldfinger extending through the header and into the window housing, a platform connected to the cold finger, and an infrared sensor assembly positioned on the platform.

A method for forming a cooled infrared camera includes forming a header, which comprises explosively welding a first flange to a first end of a first sidewall, and explosively welding a second flange to a second end of the first sidewall. The method further includes explosively welding a base connected to a coldfinger to the second flange of the header, joining the base and the second flange of the header to a warm end, joining a platform to the coldfinger, positioning an infrared sensor assembly on the platform, connecting a coldshield having an optical filter to the platform over the infrared sensor assembly, and forming a window housing. Forming a window housing comprises soldering a window to a plate at an opening of the plate, explosively welding the plate to a first end of a second sidewall, and explosively welding a third flange to a second end of the second sidewall. The third flange of the window housing is welded to the first flange of the header to form a hermetically sealed chamber within the window housing and the header.

DETAILED DESCRIPTION

Materials used to build cooled infrared cameras are often limited to a subset of options that work well with conventional joining processes (such as brazing, electron beam welding, and laser welding), are good CTE matches to adjacent components, or would work for forming the entirety of the cooled infrared camera. For example, many materials could not traditionally be used because the window housing could not be welded to the header via conventional welding. Thus, the entire cooled infrared camera had to be made of material compatible with conventional joining methods. The window housing and header of a traditional cooled infrared camera are often made of a single material. As such, once a material is selected for a portion of the window housing or a portion of the header of the cooled infrared camera, that material is used for the entirety of the window housing and the header. Further, in conventional welding, the weld area is often weaker than the base metals.

In general, the present disclosure describes a cooled infrared camera that includes stronger explosively welded joints to join dissimilar materials such that the cooled infrared camera is made of different materials selected for specific advantages in particular areas of the cooled infrared camera, allowing for better overall performance. Materials are selected from a larger group of options and based on the desired physical characteristics for each component, or for each region of a single component, without the concern of having different CTEs or difficulty in joining the dissimilar materials.

Figure 1:
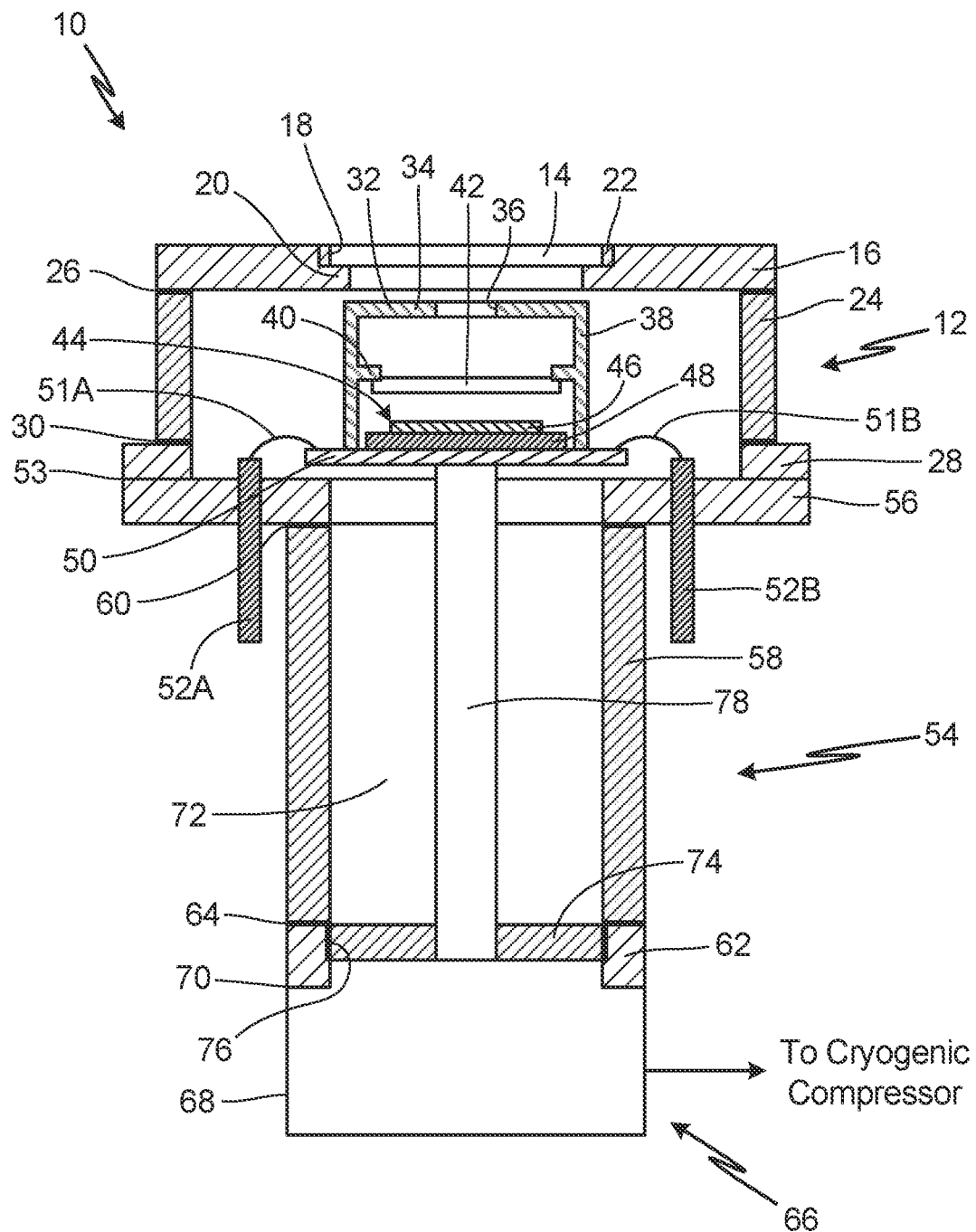
FIG. 1 is a schematic cross-sectional view of a cooled infrared camera.
Figure 2:
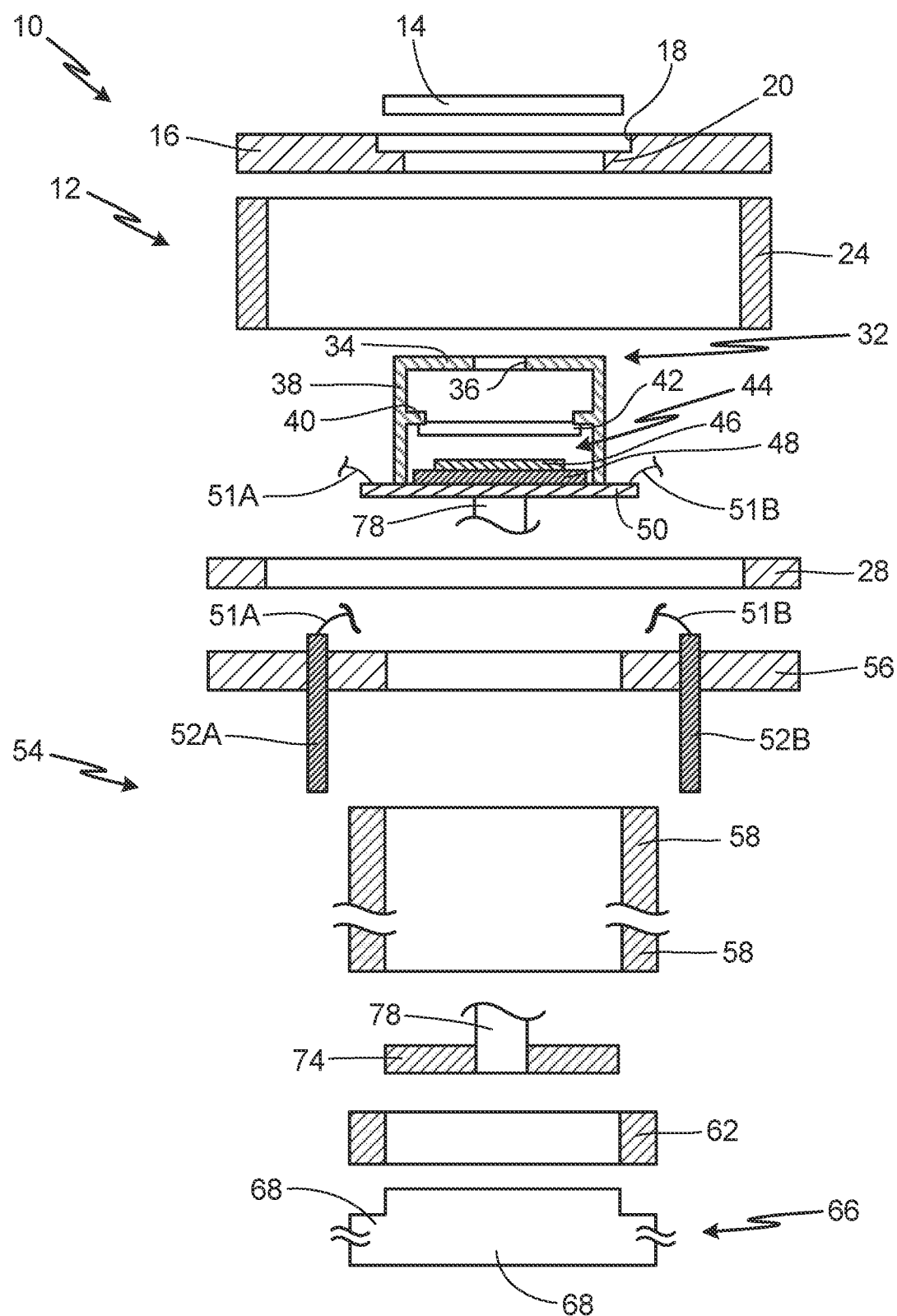
FIG. 2 is an exploded schematic cross-sectional view of the cooled infrared camera of FIG. 1.

FIG. 1 is a schematic cross-sectional view of cooled infrared camera 10. FIG. 2 is an exploded schematic cross-sectional view of cooled infrared camera 10. Cooled infrared camera 10 includes window housing 12 (which includes window 14, plate 16 having opening 18 and shoulder 20, solder joint 22 (shown in FIG. 1), sidewall 24, explosively welded joint 26 (shown in FIG. 1), flange 28, and explosively welded joint 30 (shown in FIG. 1)). Cooled infrared camera 10 also includes coldshield 32 (which includes top 34, cold stop 36, sidewall 38, and baffle 40), optical filter 42, infrared sensor assembly 44 (which includes detector 46 and integrated chip 48), platform 50, wire 51A and wire 51B, hermetic feedthrough 52A and hermetic feedthrough 52B, weld joint 53 (shown in FIG. 1) Header 54 (which includes flange 56, sidewall 58, explosively welded joint 60 (shown in FIG. 1), flange 62, and explosively welded joint 64 (shown in FIG. 1)), cryogenic cooler 66 (which includes warm end 68), weld joint 70 (shown in FIG. 1), chamber 72

(shown in FIG. 1), base 74, explosively welded joint 76 (shown in FIG. 1), and coldfinger 78 also form part of cooled infrared camera 10.

Cooled infrared camera 10 has window housing 12 with window 14 positioned in plate 16. Window housing 12 is machined. Plate 16 of window housing 12 is a disk-like portion having circular opening 18 through the center. Opening 18 has shoulder 20. Window 14 is positioned in opening 18 of plate 16 of window housing 12 on top of shoulder 20 of plate 16. Window 14 is connected to plate 16 of window housing 12 via solder joint 22. Plate 16 is joined, or connected, to a first end of sidewall 24 via explosively welded joint 26. Explosively welded joint 26 is between plate 16 and sidewall 24. Explosively welded joint 26 is formed via explosive welding. Plate 16 is made of a first material, and sidewall 24 is made of a different second material. First material of plate 16 may be a nickel-iron alloy (Alloy 42), 64FeNi (Invar), an iron-nickel-cobalt alloy (Kovar), titanium, stainless steel, tungsten, copper tungsten, and/or any other suitable metal having high strength, low weight, good hermeticity, radiation shielding ability, and/or any other desirable characteristic. First material has a coefficient of thermal expansion (CTE) that closely matches the CTE of window 14. Second material of sidewall 24 may be Alloy 42, Invar, Kovar, titanium, stainless steel, tungsten, copper tungsten, and/or any other suitable metal having high strength, low weight, good hermeticity, radiation shielding ability, and/or any other desirable characteristic. A second end of sidewall 24 is joined, or connected, to flange 28 via explosively welded joint 30. Explosively welded joint 30 is between sidewall 24 and flange 28. Sidewall 24 is between plate 16 and flange 28. Flange 28 is made of a third material that is different than the second material of sidewall 24. The third material of flange 28 may be the same or different than the first material of plate 16. Third material of flange 28 may be Alloy 42, Invar, Kovar, titanium, stainless steel, tungsten, copper tungsten, and/or any other suitable metal having high strength, low weight, good hermeticity, radiation shielding ability, and/or any other desirable characteristic.

Coldshield 32 is positioned within window housing 12. Coldshield 32 has top 34 with cold stop 36, which is an opening extending through top 34. Sidewall 38 is a sidewall that extends from top 34. Baffle 40 extends inward from sidewall 38. Optical filter 34 is bonded to baffle 40 of coldshield 32. Infrared sensor assembly 44 is positioned within coldshield 32 below optical filter 34. Infrared sensor assembly 44 has detector 46 positioned on integrated chip 48, which is positioned on platform 50. As such, infrared sensor assembly 44 is positioned on platform 50 and is between platform 50 and optical filter 42. Coldshield 32 is positioned on platform 50 over infrared sensor assembly 44 such that cold stop 36 is above infrared sensor assembly 44 and coldshield 32 surrounds infrared sensor assembly 44. Platform 50 is made of ceramic, such as alumina, aluminum nitride, or any other suitable thermal conductor that provides sufficient stiffness and is not electrically conductive. Wire 51A is connected to a first side of platform 50, and wire 51B is connected to a second side of platform 50. Wires 51A and 51B are connected to platform 50 via pins or other suitable connectors. Wires 51A and 51B may be flexible cables. Wire 51A extends out of window housing 12 through hermetic feedthrough 52A, and wire 51B extends out of window housing 12 through hermetic feedthrough 52B. Wires 51A and 51B are connected to an external system outside of window housing 12. Hermetic feedthroughs 52A and 52B are made of ceramic or may be hermetic connectors. Cooled infrared camera 10 may include as many wires 51A and 51B and corresponding hermetic feedthroughs 52A and 52B as needed to provide connection between infrared sensor assembly 44 and external processing circuitry.

A bottom end of window housing 12 is connected via weld joint 53 to a top end of header 54. As such, weld joint 53 is between window housing 12 and header 54. Weld joint 53 is a joint formed by conventional welding techniques, such as electron beam welding and laser welding. More specifically, flange 28 of window housing 12 is joined, or connected, to a first end of flange 56 of header 54 via weld joint 53. Flange 56 of header 54 is a rim or collar extending out from sidewall 58. Hermetic feedthroughs 52A and 52B extend through flange 56 and are brazed to flange 56. A second end of flange 56 is joined, or connected, to a first end of sidewall 58 via explosively welded joint 60. Explosively welded joint 60 is between flange 56 and sidewall 58. Explosively welded joint 60 is formed via explosive welding. Flange 56 is made of a fourth material, and sidewall 58 is made of a different fifth material. Fourth material of flange 56 may be Alloy 42, Invar, Kovar, titanium, stainless steel, tungsten, copper tungsten, and/or any other suitable metal having high strength, low weight, good hermeticity, radiation shielding ability, and/or any other desirable characteristic. Fifth material of sidewall 58 may be Alloy 42, Invar, Kovar, titanium, stainless steel, tungsten, copper tungsten, and/or any other suitable metal having high strength, low weight, good hermeticity, radiation shielding ability, and/or any other desirable characteristic. A second end of sidewall 58 is joined, or connected, to flange 62 via explosively welded joint 64. Explosively welded joint 64 is between sidewall 58 and flange 62. Explosively welded joint 64 is formed via explosive welding. As such, sidewall 58 is between flange 56 and flange 62. Flange 62 is made of a sixth material that is different than the fifth material of sidewall 58. The sixth material of flange 62 may be the same or different than the fourth material of flange 56. Sixth material of flange 62 may be Alloy 42, Invar, Kovar, titanium, stainless steel, tungsten, copper tungsten, and/or any other suitable metal having high strength, low weight, good hermeticity, radiation shielding ability, and/or any other desirable characteristic, or any other suitable material.

Cryogenic cooler 66 has warm end 68 connected to flange 62 via weld joint 70. As such, weld joint 70 is between header 54 and warm end 68. Weld joint 70 is a joint formed by conventional welding techniques, such as electron beam welding and laser welding. Warm end 68 is connected via tubing to a cryogenic compressor. Chamber 72 is a space formed within window housing 12 and header 54 when window housing 12 and warm end 68 are joined to header 54. Base 74 is connected to flange 62 of header 54 via explosively welded joint 76. Explosively welded joint 76 is between base 74 and flange 62. Base 74 is also connected to warm end 68 within header 54. Base 74 is made of a seventh material. Seventh material of base 74 may be Alloy 42, Invar, Kovar, titanium, stainless steel, tungsten, copper tungsten, and/or any other suitable metal having high strength, low weight, good hermeticity, radiation shielding ability, and/or any other desirable characteristic. Explosively welded joint 76 is formed via explosive welding. In alternate embodiments, welded joint 76 may be a joint formed by conventional welding, soldering, brazing, or any other suitable joining technique that is not explosive welding. Coldfinger 78 is connected to base 74 and warm end 68. Coldfinger 78 is in thermal contact with and extends from warm end 68 through base 74 and through chamber 72 within header 54 and window housing 12. Platform 50 is connected to an end of coldfinger 78 within window housing 12.

Cooled infrared camera 10 is formed by explosively welding flange 56 and flange 62 to sidewall 58 to form header 54. Base 74 connected to coldfinger 78 is explosively welded to flange 62 of header 54. Base 74 and flange 62 are joined via conventional welding to warm end 68. Platform 50 is joined to coldfinger 78. Infrared sensor assembly 44 is positioned on platform 50. Optical filter 42 is connected to coldshield 32, which is connected to platform 50 over infrared sensor assembly 44. Window 14 is soldered to plate 16 at opening 18 of plate 16. Plate 16 and flange 28 are explosively welded to sidewall 24 to form window housing 12. Flange 28 of window housing 12 is conventionally welded to flange 56 of header 54 to join window housing 12 to header 54 over coldshield 32. As such, infrared sensor assembly 44 is enclosed in hermetically sealed chamber 72 within window housing 12 and header 54.

Solder joint 22 creates a hermetic seal between window housing 12 and window 14. Window 14 provides access to infrared sensor assembly 44 by allowing infrared energy, or photons, to pass through and enter cooled infrared camera 10. Explosively welded joint 26 creates a hermetic seal between plate 16 and sidewall 24. Explosively welded joint 30 creates a hermetic seal between sidewall 24 and flange 28. Weld joint 53 creates a hermetic seal between flange 28 of window housing 12 and flange 56 of header 54. Explosively welded joint 60 creates a hermetic seal between flange 56 and sidewall 58. Explosively welded joint 64 creates a hermetic seal between sidewall 58 and flange 62. Weld joint 70 creates a hermetic seal between header 54 and warm end 68. As such, window housing 12, header 54, and warm end 68 are hermetically sealed to form chamber 72 of cooled infrared camera 10. Chamber 72 is evacuated to form a vacuum within chamber 72.

The temperature of infrared sensor assembly 44 is reduced by heat transfer from coldshield 32 and infrared sensor assembly 44 to coldfinger 78. The lower temperature of coldfinger 78 is produced via chemical induction, cryogens, a cryogenic engine, or any other suitable mechanism, from cryogenic cooler 66. Cryogenic cooler 66 may circulate cryogenic fluid through warm end 70 and coldfinger 78 such that cryogenically cooled fluid flows through coldfinger 78. Coldfinger 78 and the vacuum within chamber 72 maintain a cold environment around infrared sensor assembly 44. Reduced temperatures are required in order to increase signal-to-noise ratio by reducing thermal noise generated in infrared sensor assembly 44. Coldfinger 78 also reduces temperatures of platform 50, coldshield 32, and optical filter 42. Platform 50 is a ceramic multilayer board that reroutes signal traces to communicate readings from infrared sensor assembly 44 through wires 51A and 51B and through hermetic feedthroughs 52A and 52B, respectively, to maintain signal integrity and transmit the signal from infrared sensor assembly 44 to external processing, such as a focal plane processing system. Coldshield 32 has a cold stop 36 that acts as an intermediate focus and reduces the number of photons that reach infrared sensor assembly 44. As such, coldshield 32 controls stray light and limits input to infrared sensor assembly 44 in order to acquire the desired readings from infrared sensor assembly 44. Optical filter 42 blocks out wavelengths that are not of interest and transmits wavelengths that are of interest to infrared sensor assembly 44. Detector 46 of infrared sensor assembly 44 turns infrared radiation into very weak electrical signals. The integrated chip 48 of infrared sensor assembly 44 is a readout integrated circuit that accumulates those weak electrical signals and amplifies them so that they can be sent out to the external processing, or a computer electrically connected to cooled infrared camera 10. Cooled infrared camera 10 maintains a cool environment so that infrared sensor assembly 44 functions properly in various applications. Cooled infrared camera 10 can be used in applications such as tanks, airborne applications, and space-based applications.

Explosively welded joints 26, 30, 60, and 64 join dissimilar materials together, including materials having different CTEs and different thermal conductivities. Plate 16, sidewall 24, and flange 28 of window housing 12 can be made of different materials. Flange 56, sidewall 58, and flange 62 of header 54 can be made of different materials. As such, window housing 12 is made of different materials, and header 54 is made of different materials. Likewise, window housing 12 and header 54 can be made of different materials.

Materials within window housing 12 and header 54 and between window housing 12 and header 54 can be selected to provide one or more design advantages. Materials of plate 16, sidewall 24, flange 28, flange 56, sidewall 58, and flange 62 can be selected to achieve better CTE matching (such as Alloy42 to Titanium), weight reduction (such as Alloy42 to CE-7), strength increase (Alloy42 to Inconel 718), thermal isolation (Alloy42 to Titanium), vacuum life extension (VAR to Inconel 718), ionizing radiation shielding, reduced power consumption (via enhanced thermal conductivity), and/or optimization of any other desired characteristic. Materials at interfaces can continue to be made of the same material. For example, plate 16 can continue to be made of the same material that has a CTE match to window 14, and flange 56 can continue to be made of the same material that has a CTE match to hermetic feedthroughs 52A and 52B.

Materials of plate 16, sidewall 24, flange 28, flange 56, sidewall 58, and flange 62 can be mixed and matched such that materials have high and low CTE, good and poor thermal conductivities, various strengths, various sizes, and varying other characteristics. As a result, materials can vary within cooled infrared camera 10 and are suitable to each respective portion of the cooled infrared camera 10. The first material can be selected for plate 16 that has a good CTE match with window 14. For example, window 14 may be made of diamond (which has a small to zero CTE) while plate 16 and/or sidewall 24 are made of 64FeNi (Invar), or plate 16 may be made of Invar while sidewall 24 is made of Kovar, resulting in plate 16 and sidewall 24 having matching CTEs. At the same time, a lightweight material can be selected for second material of sidewall 24 for reduced weight, while the third material of flange 28 can be selected for optimal hermetic sealing with flange 56 of header 54 to maintain a vacuum. Further, flange 62 of header may be Alloy 42 while base 74 is made of titanium such that base 74 is easier to laser weld to warm end 68. Sixth material of base 74 may be selected for better CTE matching to warm end 68. Materials of other components, such as platform 50 and optical filter 42, of cooled infrared camera 10 can also be selected for optimization.

Further, materials can be selected for use in various applications, such as for radiation shielding. For example, sidewall 24 and sidewall 58 may be tungsten, copper tungsten, or any other suitable material having strong radiation characteristics in order to block radiation from affecting infrared sensor assembly 44. As a result, cooled infrared camera 10 can be used for spectroscopy or imaging in high radiation environments, such as radiation belts, which can otherwise degrade performance of cooled infrared camera 10.

Cooled infrared camera 10 having explosively welded joints 26, 30, 60, and 64 removes material selection limitations because almost any combinations of metals can be hermetically joined via explosive welding. Thus, explosive welding enables use of a wider range of materials to build cooled infrared camera 10. Cooled infrared camera 10 is not limited to only materials that can be laser welded. As such, explosively welded joints 26, 30, 60, and 64 increase options for material selection, or allow for use of a wider range of materials, for plate 16, sidewall 24, and flange 28 of window housing 12 and flange 56, sidewall 58, and flange 62 of header 54. As a result, window housing 12 and header 54 of cooled infrared camera 10 can be tailored for optimal functionality for a given application. Different materials can be selected for different sections of window housing 12 and header 54 based on the desired mechanical and physical characteristics of those sections to meet different requirements in those areas of the cooled infrared camera 10.

Explosively welded joints 26, 30, 60, and 64 allow for tunability of material within cooled infrared camera 10 such that the best material for each component can be selected, rather than selecting a single material that is satisfactory for all components of cooled infrared camera 10. By being able to selectively join a multitude of dissimilar materials, using multiple joining techniques, to form cooled infrared camera 10, optimal overall performance can be achieved by having greater control over CTE, thermal conductivity and isolation, and other characteristics such that cooled infrared camera 10 can outperform any monolithic alternative.

Cooled infrared camera 10 is also capable of being used in a wider variety of applications. Further, each explosively welded joint 26, 30, 60, and 64 has a weld area that is stronger than either of the base materials that are joined.

Discussion of Possible Embodiments

The following are non-exclusive descriptions of possible embodiments of the present invention.

A cooled infrared camera includes a window housing comprising: a plate having an opening; a window positioned in the opening of the plate; a first sidewall having a first end connected to the plate; a first flange connected to a second end of the first sidewall such that the first sidewall is between the plate and the first flange; a first explosively welded joint between the plate and the first sidewall; and a second explosively welded joint between the first sidewall and the first flange; a header connected to the first flange of the window housing; a warm end connected to the header; a hermetically sealed chamber within the window housing and the header; a coldfinger extending through the header and into the window housing; a platform connected to the cold finger; and an infrared sensor assembly positioned on the platform.

The cooled infrared camera of the preceding paragraph can optionally include, additionally and/or alternatively, any one or more of the following features, configurations and/or additional components:

The plate is made of a first material and the first sidewall is made of a second material, the first material and the second material being different materials.

The first material is Alloy 42, Invar, titanium, Kovar, stainless steel, tungsten, or copper tungsten.

The first material has a CTE that matches a CTE of the window.

The second material is Alloy 42, Invar, titanium, Kovar, stainless steel, tungsten, or copper tungsten.

The first flange is made of a third material that is different than the second material.

The third material is Alloy 42, Invar, titanium, Kovar, stainless steel, tungsten, or copper tungsten.

The window is connected to the plate via a solder joint.

The header comprises: a second flange connected to the first flange of the window housing; a second sidewall having a first end connected to the second flange; a third flange connected to a second end of the second sidewall such that the second sidewall is between the second flange and the third flange; a third explosively welded joint connected to and positioned between the second flange and the second sidewall; and a fourth explosively welded joint connected to and positioned between the second sidewall and the third flange.

The second flange is made of a fourth material and the second sidewall is made of a fifth material, the fourth material and the fifth material being different materials.

The third flange is made of a sixth material that is different than the fourth material.

The first flange of the window housing is connected to the second flange of the header via a weld joint that is formed by electron beam welding or laser welding.

A cooled infrared camera includes a window housing having an opening and a window positioned in the opening; a header connected to the window housing, the header comprising: a first flange connected to the window housing; a first sidewall having a first end connected to the first flange; a second flange connected to a second end of the first sidewall such that the first sidewall is between the first flange and the second flange; a first explosively welded joint between the first flange and the first sidewall; and a second explosively welded joint between the first sidewall and the second flange; a warm end connected to the second flange of the header; a hermetically sealed chamber within the window housing and the header; a coldfinger extending through the header and into the window housing; a platform connected to the cold finger; and an infrared sensor assembly positioned on the platform.

The cooled infrared camera of the preceding paragraph can optionally include, additionally and/or alternatively, any one or more of the following features, configurations and/or additional components:

The first flange is made of a first material and the first sidewall is made of a second material, the first material and the second material being different materials.

The first material is Alloy 42, Invar, titanium, Kovar, stainless steel, tungsten, or copper tungsten.

The second material is Alloy 42, Invar, titanium, Kovar, stainless steel, tungsten, or copper tungsten.

The second flange is made of a third material that is different than the second material.

The third material is Alloy 42, Invar, titanium, Kovar, stainless steel, tungsten, or copper tungsten.

The window housing comprises: a plate having the opening; a second sidewall having a first end connected to the plate; a third flange connected to a second end of the second sidewall such that the second sidewall is between the plate and the third flange; a third explosively welded joint connected to and positioned between the plate and the second sidewall; and a fourth explosively welded joint connected to and positioned between the second sidewall and the third flange.

The plate is made of a fourth material and the second sidewall is made of a fifth material, the fourth material and the fifth material being different materials.

The third flange is made of a sixth material that is different than the fourth material.

The third flange of the window housing is connected to the first flange of the via a weld joint that is formed by electron beam welding or laser welding.

A fifth explosively welded joint between a base of the coldfinger and the second flange of the header.

A method for forming a cooled infrared camera includes forming a header, which comprises: explosively welding a first flange to a first end of a first sidewall; and explosively welding a second flange to a second end of the first sidewall; explosively welding a base connected to a coldfinger to the second flange of the header; joining the base and the second flange of the header to a warm end; joining a platform to the coldfinger; positioning an infrared sensor assembly on the platform; connecting a coldshield having an optical filter to the platform over the infrared sensor assembly; forming a window housing, which comprises: soldering a window to a plate at an opening of the plate; explosively welding the plate to a first end of a second sidewall; and explosively welding a third flange to a second end of the second sidewall; and welding the third flange of the window housing to the first flange of the header to form a hermetically sealed chamber within the window housing and header.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A cooled infrared camera comprising:
    a window housing comprising:
        a plate having an opening;
        a window positioned in the opening of the plate;
        a first sidewall having a first end connected to the plate;
        a first flange connected to a second end of the first sidewall such that the first sidewall is between the plate and the first flange;
        a first explosively welded joint between the plate and the first sidewall; and
        a second explosively welded joint between the first sidewall and the first flange;
    a header connected to the first flange of the window housing;
    a warm end connected to the header;
    a hermetically sealed chamber within the window housing and the header;
    a coldfinger extending through the header and into the window housing;
    a platform connected to the cold finger; and
    an infrared sensor assembly positioned on the platform.

2. The cooled infrared camera of claim 1, wherein the plate is made of a first material and the first sidewall is made of a second material, the first material and the second material being different materials.

3. The cooled infrared camera of claim 2, wherein the first material is Alloy 42, Invar, titanium, Kovar, stainless steel, tungsten, or copper tungsten.

4. The cooled infrared camera of claim 2, wherein the first material has a CTE that matches a CTE of the window.

5. The cooled infrared camera of claim 2, wherein the second material is Alloy 42, Invar, titanium, Kovar, stainless steel, tungsten, or copper tungsten.

6. The cooled infrared camera of claim 2, wherein the first flange is made of a third material that is different than the second material.

7. The cooled infrared camera of claim 6, wherein the third material is Alloy 42, Invar, titanium, Kovar, stainless steel, tungsten, or copper tungsten.

8. The cooled infrared camera of claim 1, wherein the window is connected to the plate via a solder joint.

9. The cooled infrared camera of claim 1, wherein the header comprises:
    a second flange connected to the first flange of the window housing;
    a second sidewall having a first end connected to the second flange;
    a third flange connected to a second end of the second sidewall such that the second sidewall is between the second flange and the third flange;
    a third explosively welded joint connected to and positioned between the second flange and the second sidewall; and
    a fourth explosively welded joint connected to and positioned between the second sidewall and the third flange.

10. The cooled infrared camera of claim 9, wherein the second flange is made of a fourth material and the second sidewall is made of a fifth material, the fourth material and the fifth material being different materials.

11. The cooled infrared camera of claim 10, wherein the third flange is made of a sixth material that is different than the fourth material.

12. The cooled infrared camera of claim 9, wherein the first flange of the window housing is connected to the second flange of the header via a weld joint that is formed by electron beam welding or laser welding.

13. A cooled infrared camera comprising:
    a window housing having an opening and a window positioned in the opening;
    a header connected to the window housing, the header comprising:
        a first flange connected to the window housing;
        a first sidewall having a first end connected to the first flange;
        a second flange connected to a second end of the first sidewall such that the first sidewall is between the first flange and the second flange;
        a first explosively welded joint between the first flange and the first sidewall; and
        a second explosively welded joint between the first sidewall and the second flange;
    a warm end connected to the second flange of the header;
    a hermetically sealed chamber within the window housing and the header;
    a coldfinger extending through the header and into the window housing;
    a platform connected to the cold finger; and
    an infrared sensor assembly positioned on the platform.

14. The cooled infrared camera of claim 13, wherein the first flange is made of a first material and the first sidewall is made of a second material, the first material and the second material being different materials.

15. The cooled infrared camera of claim 14, wherein the first material is Alloy 42, Invar, titanium, Kovar, stainless steel, tungsten, or copper tungsten.

16. The cooled infrared camera of claim 14, wherein the second material is Alloy 42, Invar, titanium, Kovar, stainless steel, tungsten, or copper tungsten.

17. The cooled infrared camera of claim 14, wherein the second flange is made of a third material that is different than the second material.

18. The cooled infrared camera of claim 17, wherein the third material is Alloy 42, Invar, titanium, Kovar, stainless steel, tungsten, or copper tungsten.

19. The cooled infrared camera of claim 13, wherein the window housing comprises:
- a plate having the opening;
- a second sidewall having a first end connected to the plate;
- a third flange connected to a second end of the second sidewall such that the second sidewall is between the plate and the third flange;
- a third explosively welded joint connected to and positioned between the plate and the second sidewall; and
- a fourth explosively welded joint connected to and positioned between the second sidewall and the third flange.

20. The cooled infrared camera of claim 19, wherein the plate is made of a fourth material and the second sidewall is made of a fifth material, the fourth material and the fifth material being different materials.

21. The cooled infrared camera of claim 20, wherein the third flange is made of a sixth material that is different than the fourth material.

22. The cooled infrared camera of claim 19, wherein the third flange of the window housing is connected to the first flange of the via a weld joint that is formed by electron beam welding or laser welding.

23. The cooled infrared camera of claim 19, further including a fifth explosively welded joint between a base of the coldfinger and the second flange of the header.

24. A method for forming a cooled infrared camera, the method comprising:
- forming a header, which comprises:
  - explosively welding a first flange to a first end of a first sidewall; and
  - explosively welding a second flange to a second end of the first sidewall;
- explosively welding a base connected to a coldfinger to the second flange of the header;
- joining the base and the second flange of the header to a warm end;
- joining a platform to the coldfinger;
- positioning an infrared sensor assembly on the platform;
- connecting a coldshield having an optical filter to the platform over the infrared sensor assembly;
- forming a window housing, which comprises:
  - soldering a window to a plate at an opening of the plate;
  - explosively welding the plate to a first end of a second sidewall; and
  - explosively welding a third flange to a second end of the second sidewall; and
- welding the third flange of the window housing to the first flange of the header to form a hermetically sealed chamber within the window housing and the header.

* * * * *